United States Patent
Ottens et al.

(10) Patent No.: US 7,027,132 B2
(45) Date of Patent: Apr. 11, 2006

(54) LITHOGRAPHIC APPARATUS AND DEVICE MANUFACTURING METHOD

(75) Inventors: Joost Jeroen Ottens, Veldhoven (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/980,834

(22) Filed: Nov. 4, 2004

(65) Prior Publication Data

US 2005/0195382 A1  Sep. 8, 2005

Related U.S. Application Data

(63) Continuation-in-part of application No. 10/735,848, filed on Dec. 16, 2003.

(30) Foreign Application Priority Data

Nov. 5, 2003  (EP) .................. 03078504

(51) Int. Cl.
    *G03B 27/62* (2006.01)
    *G03B 27/42* (2006.01)
    *G03B 27/58* (2006.01)
(52) U.S. Cl. .............. 355/75; 355/53; 355/72
(58) Field of Classification Search .......... 355/30, 355/53, 72–76; 310/10, 12; 361/128, 324; 378/34, 35
    See application file for complete search history.

(56) References Cited

U.S. PATENT DOCUMENTS

| 5,777,838 | A | 7/1998 | Tamagawa et al. | |
| 6,033,478 | A | 3/2000 | Kholodenko | |
| 6,570,752 | B1 * | 5/2003 | Morita et al. | 361/234 |
| 6,584,168 | B1 * | 6/2003 | Hara et al. | 378/34 |
| 6,628,503 | B1 | 9/2003 | Sogard | |
| 6,710,857 | B1 | 3/2004 | Kondo | |
| 6,897,945 | B1 * | 5/2005 | Ottens et al. | 355/72 |
| 6,905,984 | B1 * | 6/2005 | Kellerman et al. | 438/597 |
| 2001/0005595 | A1 | 6/2001 | Morita et al. | |
| 2002/0101956 | A1 | 8/2002 | Hara et al. | |

FOREIGN PATENT DOCUMENTS

| EP | 0 498 752 A1 | 8/1992 |
| EP | 0 840 434 A2 | 5/1998 |
| EP | 0 840 434 A3 | 11/1998 |
| EP | 0 947 884 A2 | 10/1999 |
| EP | 0 993 024 A2 | 4/2000 |
| EP | 0 947 884 A3 | 7/2001 |
| EP | 0 993 024 A3 | 7/2002 |
| EP | 1 241 706 A2 | 9/2002 |
| EP | 1 241 706 A3 | 2/2004 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes an article support for supporting a substantially flat article to be placed in a beam path of a beam of radiation. The article support includes a plurality of supporting protrusions that define a support zone for providing a plane of support. A backfill gas feed is arranged in the support zone and provides a backfill gas that flows to a backside of the article when supported by the article support. The support zone is surrounded by a boundary zone that has a reduced height relative to the plane of support so that the backfill gas flow is permitted to exit the support zone. A tunable clamp clamps the article to the article support, and a flow measuring system measures the outflow of the backfill gas. The tunable clamp is operatively coupled to the flow measuring system to tune the clamping based on the measured outflow.

14 Claims, 5 Drawing Sheets

LITHOGRAPHIC APPARATUS AND DEVICE MANUFACTURING METHOD

CROSS-REFERENCE TO RELATED APPLICATIONS

The present application is a continuation-in-part of U.S. patent application Ser. No. 10/735,848, filed Dec. 16, 2003, the entire content of which is incorporated herein by reference. The present application also claims the benefit of priority from European Patent Application No. 3078504.2, filed Nov. 5, 2003, the entire content of which is incorporated herein by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction), while synchronously scanning the substrate parallel or anti-parallel to this direction.

In a conventional lithographic projection apparatus, during photolithographic processes, an article, such as a wafer or reticle is clamped on an article support by a clamping force, that may range from vacuum pressure forces, electrostatic forces, intermolecular binding forces or just gravity force. The article support defines a plane, in the form of a plurality of protrusions that define an even flat surface on which the wafer or reticle is held. Tiny variations in the height of these protrusions may be detrimental to image resolution, because a small deflection of the article from an ideal plane orientation may result in rotation of the wafer and a resulting overlay error due to this rotation. In addition, such height variations of the article support may result in height variation of the article that is supported thereby. During the lithographic process, such height variations may affect image resolution due to a limited focal distance of the projection system. Therefore, the article support may be flat.

European patent application EP0947884 describes a lithographic apparatus having a substrate holder in which protrusions are arranged to improve the flatness of the substrate. These protrusions have a general diameter of 0.5 mm and are located generally at a distance of 3 mm away from each other, thereby forming a bed of supporting members that support the substrate. For an electrostatic clamp, typically, the height of the protrusions lies in the range 1 mu m–15 mu m. Due to the relative large spaces in between the protrusions, contaminations that are possibly present generally do not form an obstruction for the flatness of the substrate, since these will be lying in between the protrusions and will not lift the substrate locally.

In the context of this application, the "article" may be any of the above mentioned terms wafer, reticle, mask, or substrate, more specifically, terms such as a substrate to be processed in manufacturing devices employing lithographic projection techniques, or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

In lithographic processing, passing of the projection beam through gas compositions present between the illumination system and the articles to be illuminated, in particular non-homogenous gas compositions, may cause undesired effects such as diffraction, refraction and absorption. These effects may have an adverse effect on illumination quality, in particular, on a suitable resolution to be reached for the ever increasing demand in imaging performance. A new generation of lithography, the EUV-lithography, which uses a projection beam in the Extreme UltraViolet area, therefore operates in or near vacuum conditions in order to allow the projection beam of radiation to pass substantially unhindered to the article to be placed in the beam. In this context, the term vacuum pressure is relative to particular gasses that are present in the environment. For example, for carbonhydrogens and water, the allowable background pressure is very low, in the order of 1e-9–1e-12 millibar. For inert gasses, the requirements are less strict, for example, for Ar an allowable background pressure ranges from 1e-4 mbar–1e-2 mbar, in particular, a pressure of 1e-3 mbar. Also, the relative background pressure may vary in terms of the environment of the apparatus. For example, where the article support functions in the environment of a wafer support, the vacuum requirements for certain components may be less strict than in the environment where the article support functions as a reticle support. That is, the partial pressures for contaminants (such as CxHy and H2O) may differ by a factor of 100 between the optics compartment (including reticle support) and the wafer compartment and are much lower than the total pressure (typical numbers are 1e-9 to 1e-12 mbar).

This vacuum technology offers challenges in terms of temperature control. For example, in some cases, an article support may have only a very small part (ranging from 0.1 to 3% of a total area) of the bottom side of the article that actually makes physical contact with the article support when supported thereby, since the protrusions are shaped to provide only a very small contact area and the protrusions are furthermore spaced relatively wide apart. In the vacuum pressure ranges that are used, thermal conductivity is substantially proportional to the pressure, which means that the thermal energy absorbed by the article when placed in the projection beam may no longer be adequately diverted, so that unwanted thermal heating of the article supports, leading to thermal expansion and resulting projection inaccuracies or potentially to even the loss of the article. To overcome this problem, in some instances, use is made of a so-called back-fill gas, which offers a thermal conduction from the article to the article support to divert the thermal energy absorbed by the article. The article support may be further provided with a cooling structure, such as cooling ducts containing cooling media etc. However, to confine the back-fill gas to the bottom side of the article, a conventional approach typically provides a so-called "hard rim", which is a boundary wall that substantially seals off the backfill gas from the vacuum by forming a gas seal between the bottom side of the article and the upper side of the article support. A hard rim type article support is known, for example, from European patent serial number EP1241706.

It has been found that, in terms of illumination performance, such a hard rim may cause problems. For an article, such as a substrate at wafer level or a reticle in a reticle stage, the rim may result in an estimated deflection of 75 nm, which may cause a deteriorated image resolution. The presence of a sealing rim provides additional support to carry the article. Such additional support may disturb the pressure load of the article, which may cause local bending of the article. Such bending introduces rotation of the article surface, which may cause overlay effects that are undesired. Furthermore, a sealing rim provides almost a doubling of the contact area between the article and article support. This may be undesirable because it is an aim to minimize such contact area in order to prevent contamination particles to come in between the contact zones, and contamination particle may create unevenness of support and corresponding bending problems of the article.

Furthermore, the presence of such a hard rim defines a definite outer area of the article where no backfill gas is present to provide thermal conductivity. This may cause local overheating or undesired temperature gradients in the article.

SUMMARY

In an embodiment of the invention, a lithographic apparatus is provided. The lithographic apparatus includes an illumination system for conditioning a beam of radiation, and an article support for supporting a substantially flat article to be placed in a beam path of the beam of radiation. The article support includes a plurality of supporting protrusions. The plurality of supporting protrusions define a support zone for providing a substantially flat plane of support. A backfill gas feed is arranged in the support zone for providing a backfill gas that flows to a backside of the article when supported by the article support. The backfill gas feed provides an improved thermal conduction between the article and the article support. The support zone is surrounded by a boundary zone that has a reduced height relative to the plane of support so that the backfill gas flow is permitted to exit the support zone. The apparatus also includes a tunable clamp for clamping the article to the article support, and a flow measuring system that measures the outflow of the backfill gas. The tunable clamp is operatively coupled to the flow measuring system to tune the clamping based on the measured outflow.

Thus, the article may be kept in an improved level condition because the boundary zone is not in contact with the article, thus resulting in flatness variations significantly lower than the above indicated 75 nm.

Further, generally, in hard rim configurations, the article extends beyond the hard rim. Hence, in such configurations, in a boundary zone of the article, no thermal conductivity is provided due to the absence of backfill gas. In one embodiment of the invention, even in the reduced backfill gas pressure zone, outside the enclosed area, thermal conductivity is provided which provides improved thermal conductivity in the boundary zone of the article.

According to an embodiment of the invention, the boundary zone includes a boundary wall defining a boundary wall height that lies below the plane of support. In an embodiment, the boundary wall defines a gap of more than 50 nm, in particular, more than 100 nm. In an embodiment, the boundary zone does not include a boundary wall. Although counter intuitive, the inventors have found that for a conventional protrusion height of 5 mu m, in an optimized configuration, the leaking seal may be altogether absent, resulting in a leaking rate of 1 mbar*l/s, which is acceptable for a wafer stage.

Hence it follows that the hard rim seal configuration may be dispensed with, which may result in better leveling properties of the article support. In some designs, it may be beneficial to have some sort of seal, in particular a "non-contact" seal, or "leaking" seal, that forms an increased flow resistance to limit the gas flow and increase the gas pressure near the boundary of the article. Therefore, preferably, the boundary zone includes a boundary wall defining a boundary wall height that lies below the plane of support. This embodiment works particularly well where the backfill gas is an inert gas, such as Argon.

For these kinds of gasses, in an embodiment using an electrostatic clamp, the allowable background pressure of the vacuum surrounding is relative high and a leaking rate of less than 1 mbar*l/s, in particular 0.15 mbar*l/s, is acceptable for Argon as a backfill gas, depending on the relative position of the article support. In the absence of a sealing boundary, the leaking rate was calculated to be 0.12 mbar*l/s, which was found to be within the above indicated upper limit. In an embodiment, the calculated leak rate was 3e-3 mbar*l/s, which is far within above maximum specification. These values are for an applied background pressure of 1e-3 mbar. When the background pressure of the vacuum environment is lower, the leaking rate will be lowered correspondingly.

Although the backfill gas configuration of the invention may be operated in other pressure environments, preferably, the invention is preferably used in a lithographic apparatus according any of the above embodiments, and further includes a vacuum pump system for providing a vacuum pressure for operating the lithographic apparatus in vacuum pressure conditions. The vacuum pump operates to eliminate backfill gas flowing from the backside of the article.

In such a configuration, the vacuum pump, in particular, a vacuum turbo pump, is operated to remove the leaking backfill gas. Such removal is practiced efficiently if the vacuum pump system includes a suction zone that encloses the support zone. In such a case, escaping back fill gas particles may be captured directly before possibly adversely affecting the illumination process. The invention is preferably used in an embodiment in which the article is clamped on the article support by an electrostatic clamp. An embodiment includes a tunable clamp for clamping the article to the article support; and a flow meter for measuring the outflow of the backfill gas pressure. The tunable clamp is coupled to the flow meter to tune the clamping pressure in response to a measured outflow. Using this configuration, effectively undesired contact of the article with the article support, in particular, with a boundary wall thereof, may be prevented while minimizing the amount of outflow of backfill gas from the support zone.

In an embodiment, an article support for supporting a substantially flat article to be placed in a beam path of a beam of radiation conditioned by an illumination system in a lithographic apparatus is provided. The article support includes a plurality of supporting protrusions that define a support zone for providing a substantially flat plane of support, and a backfill gas feed arranged in the support zone for providing a backfill gas flow to a backside of the article when supported by the article support. The backfill gas feed provides an improved thermal conduction between the article and the article support. The support zone is surrounded by a boundary zone that has a reduced height relative to the plane of support so that the backfill gas flow is permitted to exit the support zone. The article support also includes a tunable clamp for clamping the article to the article support, and a flow measuring system that measures the outflow of the backfill gas. The tunable clamp is operatively coupled to the flow meter to tune the clamping based on the measured outflow.

In an embodiment, a method for clamping an article to an article support in a lithographic apparatus is provided. The method includes supporting the article on the article support. The article support includes a plurality of supporting protrusions that define a support zone for providing a substantially flat plane of support. The support zone is surrounded by a boundary zone that has a reduced height relative to the plane of support. The method also includes flowing a backfill gas to a backside of the article, measuring the backfill gas flow, clamping the article to the article support with a force based on the measuring of the backfill gas flow so that the backfill gas is permitted to exit the support zone.

In an embodiment according to the invention, a method is provided for clamping an article to an article support in a lithographic apparatus, including: supporting the article on an article support including a plurality of supporting protrusions, the plurality of protrusions defining a support zone for providing a flat plane of support and the support zone being surrounded by a boundary zone having a reduced height relative to the plane of support; providing a backfill gas flow to a backside of the article; and clamping the article to the article support in response to measuring the backfill gas flow, wherein the clamping is tuned so that the backfill gas flow is not bounded to the support zone.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
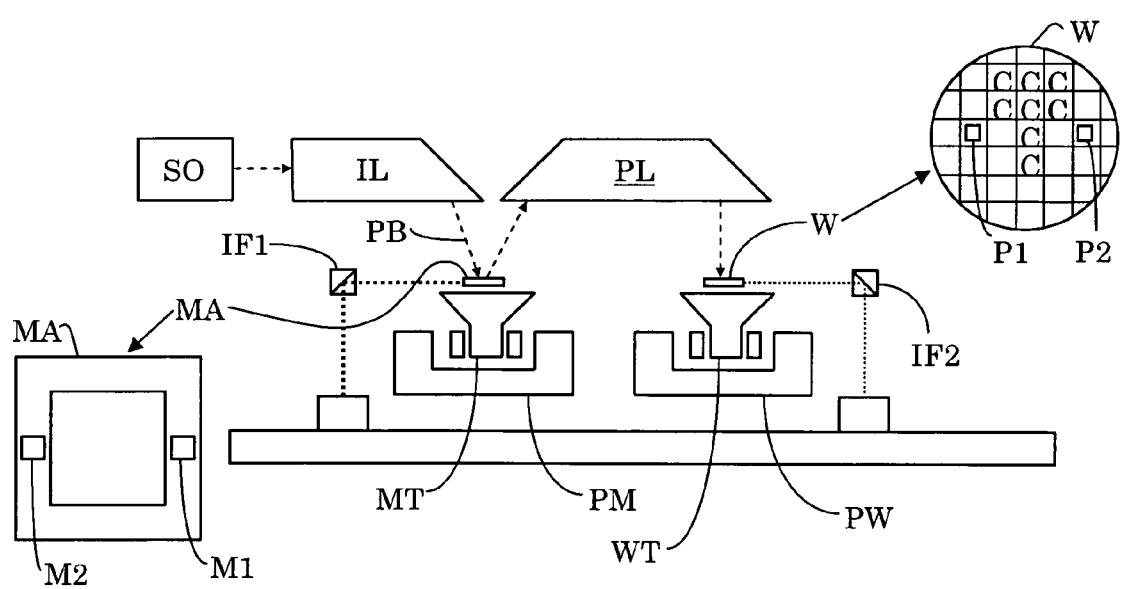
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV or EUV radiation); a first support structure (e.g. a mask table) MT for supporting a patterning device (e.g. a mask) MA and connected to first positioning device PM for accurately positioning the patterning device with respect to item PL; a second support structure (e.g. a substrate table or wafer table) WT for holding a substrate (e.g. a resist-coated wafer) W and connected to second positioning device PW for accurately positioning the substrate with respect to item PL; and a projection system (e.g. a reflective projection lens) PL for imaging a pattern imparted to the projection beam PB by patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector including for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjuster for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
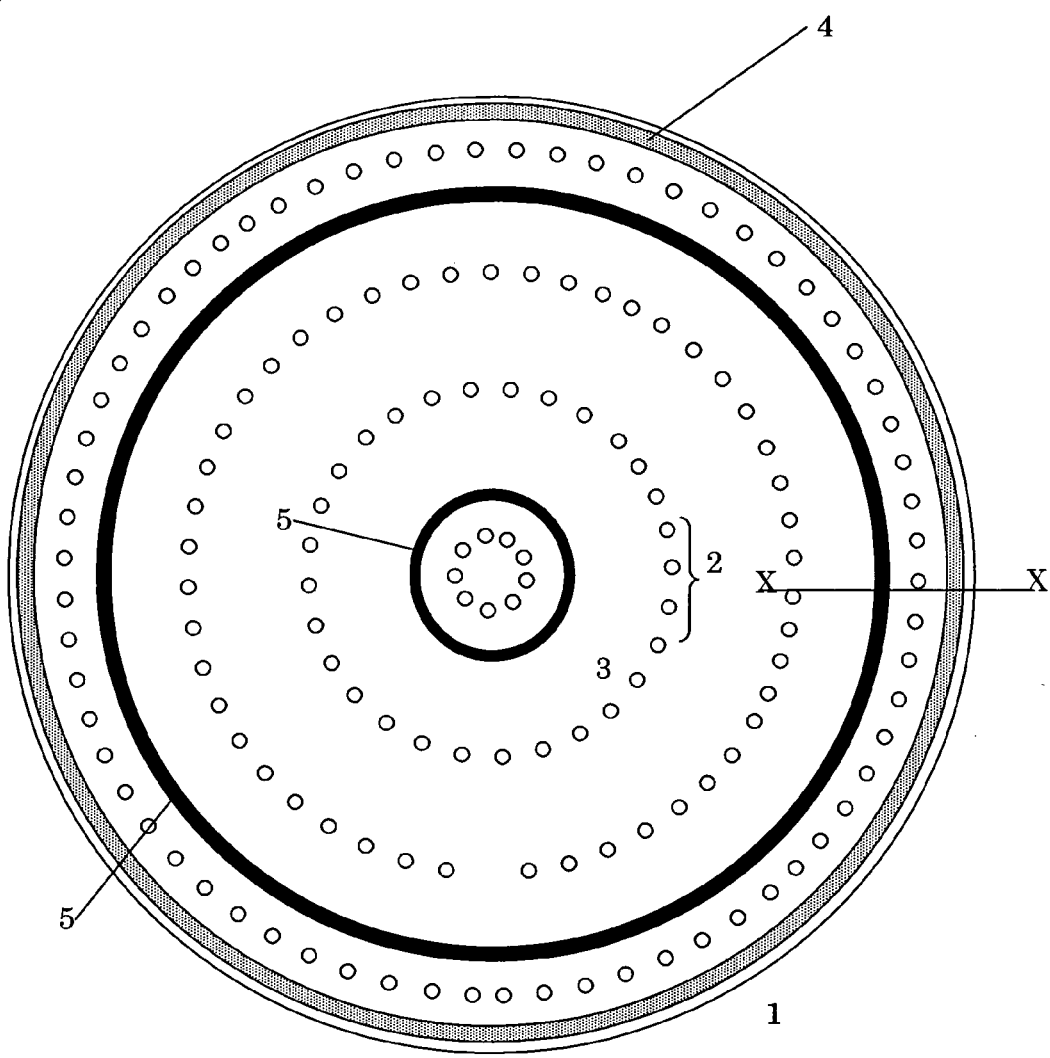
FIG. 2 depicts an embodiment of an article support according to the invention.

FIG. 2 depicts an article support 1. In this embodiment, the article support 1 is for supporting a wafer, shortly to be called a wafer support table, and is generally circular in form, which is a common shape for wafer support tables. However, the article support may also be of another shape, in particular, a square shape. The wafer support table 1 includes a plurality of protrusions 2 that are dimensioned to provide a flat support for supporting a wafer (not shown). For clarity's sake, only a few protrusions 2 are referenced; generally, in the drawings they are indicated by open circles. The protrusions 2 thereby define a support zone 3. The boundary of the support zone 3 is formed by a surrounding wall 4, which may form a seal for confining backfill gas (not shown in FIG. 2) within the support zone 3. In the wafer support table 1 of FIG. 2, backfill gas is introduced via gas feeds 5, which are located at selected positions. In the shown embodiment, the feeds 5 are channel shaped; other forms may also be used. In a conventional embodiment, the surrounding wall would be of the same height as the supporting protrusions 2 and thereby forms a so-called "hard-rim" supporting element for also supporting the wafer. This type of support is indicated as a "hard-rim" seal since the boundary wall physically contacts the wafer during sealing and presses the bottom side thereof. This causes the wafer to deform and unevenness is introduced in the support of the wafer, so that the wafer surface to be irradiated is not perfectly flat.

According to an embodiment of the invention, as follows from FIG. 3, the supporting zone 3 is not bounded by a hard-rim seal but by a boundary zone 4 having a reduced height relative to the plane of support 20 so that the backfill gas flow is not bounded to the support zone 3. Thus, the backfill gas is permitted to exit the support zone 3. In this way, the boundary zone 4 indicated in FIG. 3 forms a "leaking seal" 4. The distance between the top of the leaking seal 4 and the plane of support 20 form a gap 22 through which backfill gas may flow. This leaking seal 4 may be absent, provided that the flow characteristics of the backfill gas pressure, in relation to the feed positions is such that a sufficient pressure can be built up in the presence of the ambient pressure, which is often a vacuum pressure.

Figure 3:
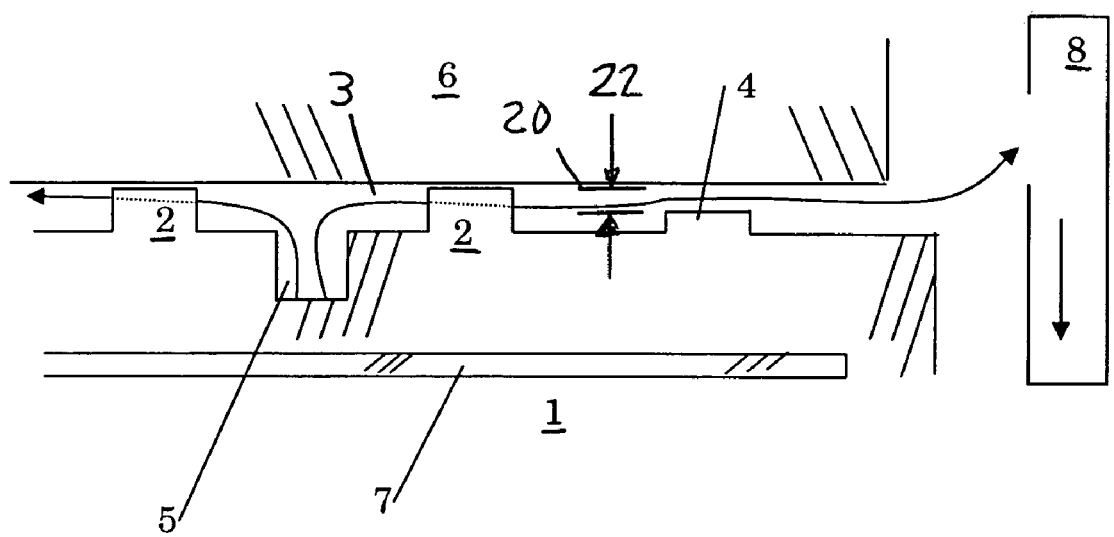
FIG. 3 depicts a side view of the article support according to FIG. 2 taken along the line X—X.

FIG. 3 shows a schematic height map of the article support 1 along the lines X—X depicted in FIG. 2. A wafer 6 is positioned on top of the protrusions 2 (for clarity's sake FIG. 3 is depicted with a slight clearance between the wafer 6 and the protrusions 2) and clamped by an electrostatic clamp 7. The height of the protrusions 2 is a conventional height of approximately 5 mu m, whereas the leaking seal 4 is lowered with respect to that height by an amount of 0.1–5 mu m. It is noted that in an optimized configuration, the leaking seal 4 may be altogether absent.

Directly outside of the wafer support, a suction pump 8 may be present to trap outflowing gas.

Figure 4:
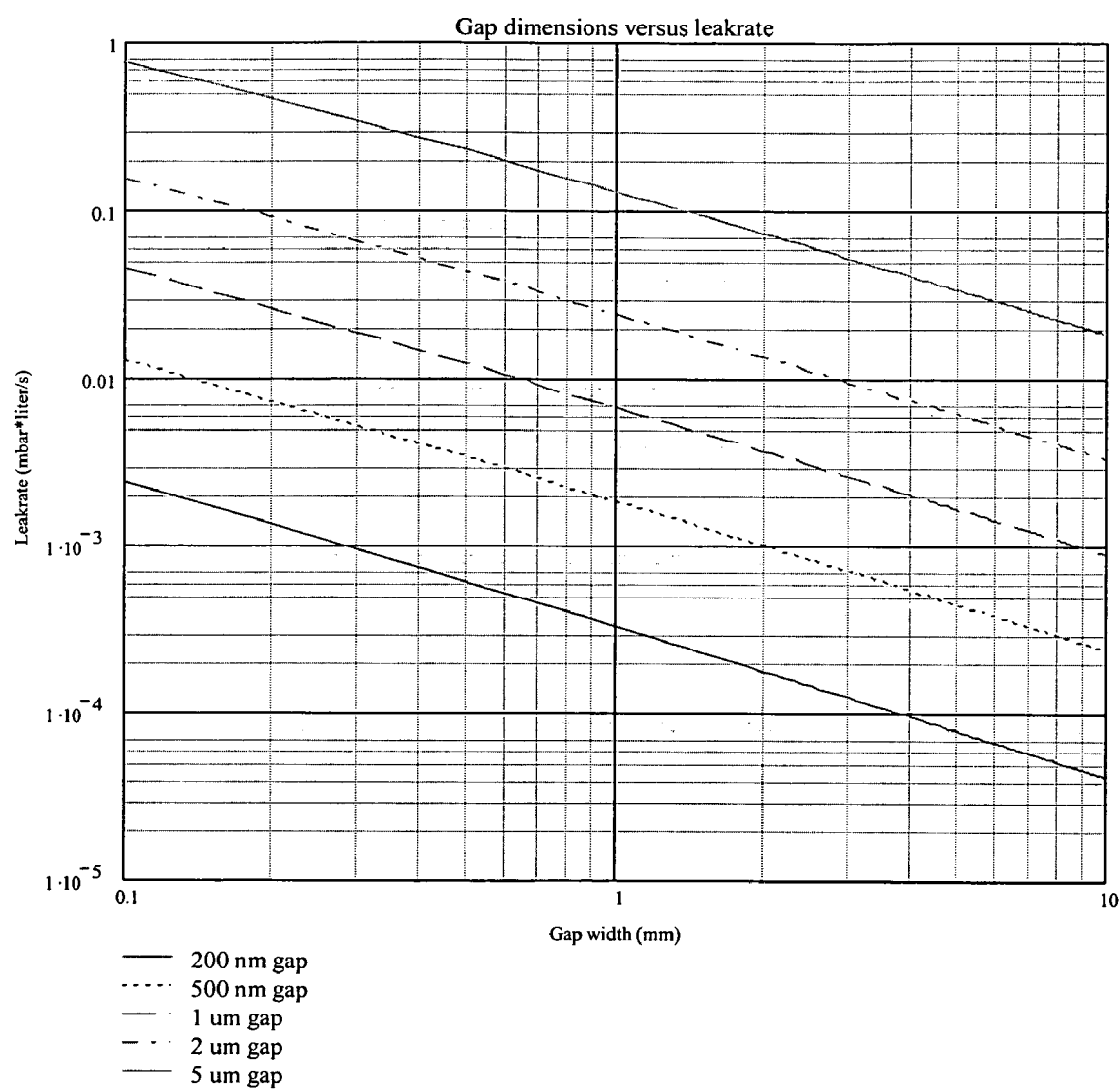
FIG. 4 illustrates a calculated leak rate depending on the geometry of the boundary wall.

FIG. 4 illustrates, according to an embodiment of the invention, the leak rates that are calculated depending on a particular geometry of the boundary wall 4 for a standard wafer having a circumference of 942 mm. This geometry includes a boundary wall 4 that has a lowered seal (indicated as a "gap" 22) of 200; 500; 1000; 2000 and 5000 nm. As expected, the leak rate increases with the gap width, which corresponds to the distance of the boundary wall 4 to the gas supply feed 5, so that the lowest line in the chart corresponds to the lowest value and the upper line in the chart corresponds to the highest value of the gap 22. Furthermore, the gap width, corresponding to the distance of the boundary wall 4 to the gas supply feed 5, ranges from 0.1 mm to 10 mm. It is shown that in the indicated ranges, the leaking rate, expressed in mbar*liters/second varies from 0.5e-4 to close to 1. For realistic embodiments, the leak rate of the backfill gas into the stage compartment should be less than 1 mbar*liter/s, more preferably less than 0.1 mbar*liter/s, most preferably less than 11 e-5 mbar*liter/s. For a gap 22 of 5 um and width of 1 mm, the leaking rate is about 0.12 mbar*l/s, well within the specified maximum leak rate. These values are for an applied (total) background pressure of about 1e-3 mbar. Furthermore, the leak rate of the backfill gas into the stage compartment should be less than 0.01 mbar*liter/s, more preferably less than 1e-3 mbar*liter/s, most preferably less than 1e-7 mbar*liter/s.

Hence, when the outer gas supply 5 is more than one mm outside the edge, the gap 22 may be as much as 5 um. An embodiment for a wafer includes a gap 22 of 500 nm and 0.5 mm gap width, giving rise to a leak rate of 3e-3 mbar*l/s. For a reticle stage, such an embodiment includes a gap width of 2 mm and a gap 22 of 200 nm for a total circumference of 1136 mm.

Figure 5:
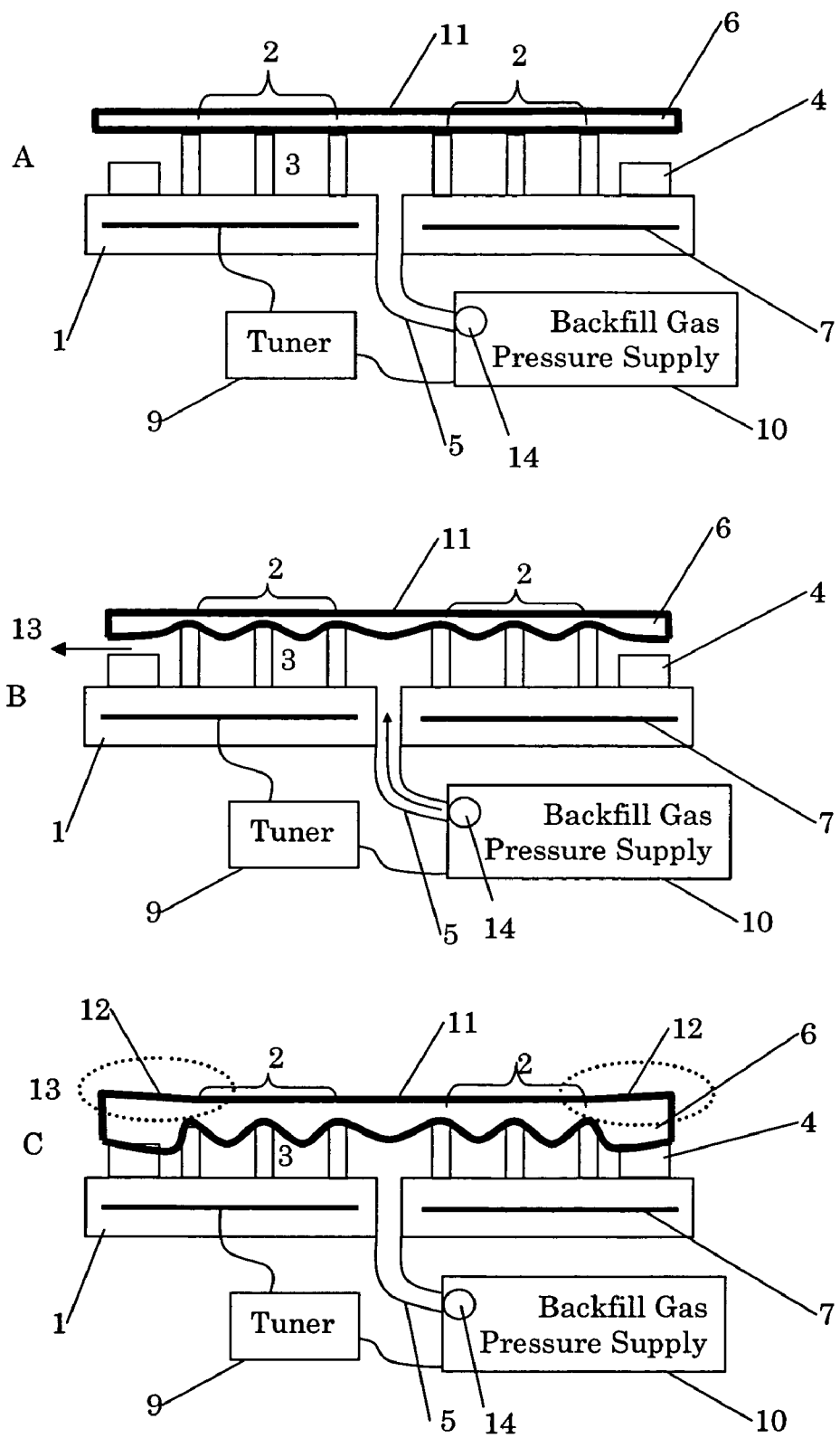
FIG. 5 illustrates an embodiment of a device and method according to the invention.

FIGS. 5A–C show the article support arrangement 1 as in FIG. 3, in which varying clamping pressures are applied to a wafer 6, and showing various deformation behavior of the wafer 6 in clamped condition. It is noted that this behavior is only schematically indicated, and the deformations are not necessarily depicted in scale.

In these embodiments, the wafer 6 is clamped to the support 1 using a tunable electrostatic clamp 7. To this end, a tuner 9 is present that is coupled to a backfill gas pressure supply 10. In response to the measured flow rate of the backfill gas pressure supply 10 by a flow measuring system 14, the tuner 9 presets the clamping pressure of the electrostatic clamp 7. FIG. 5A illustrates an unclamped situation, where an article 6 is supported on the protrusions 2 without additional clamping pressure of the clamp 7. In this situation, the article, in particular, the top surface 11 is substantially flat.

In FIG. 5B, a preferred clamped situation is illustrated. Here, the clamping pressure is adjusted in such a way that the wafer substantially evenly "sinks" over the protrusions 2 (which, within certain ranges, also plastically deform), and the top surface remains substantially flat within predetermined tolerances so that the lithographic process may be carried out having minimal overlay defects. In this situation, the boundary wall 4 does not touch or support the wafer 6, so that backfill gas flow is not bounded to the support zone 3, but may flow into the ambient pressure environment 13, and is thus permitted to exit the support zone 3.

FIG. 5C schematically shows a clamping configuration in which the wafer surface 11 is deformed out of the tolerance range, especially near the boundary of the wafer indicated by areas 12, due to contact with the boundary wall 4. Here, the boundary wall 4 supports the wafer 6 that, in combination with the support of the protrusions 2, results in uneven support conditions, which may cause overlay problems that exceed a predefined flatness tolerance range of for example 25 nm.

The method according to the invention uses the principle of gas flow detection in order to determine the critical clamping pressure where the wafer 6 contacts the boundary wall 4. As the wafer 6 contacts the wall 4, the gas outflow from the support zone 3 towards the ambient pressure environment 13 is substantially stopped, which may be detected by measuring flow speed and/or pressure levels in the support zone 3.

As long as the wafer 6 does not contact the wall 4, the top surface 11 remains substantially flat within predetermined tolerances. Thus, the backfill gas flow may be used as an indicator for the surface flatness of the wafer. In order to minimize the outflow of gas into the ambient pressure environment, which is in an embodiment a vacuum pressure environment, the clamping pressure is tuned so that the backfill gas flow reaches a predetermined non-zero flow rate. In this condition, the wafer 6 does not touch the boundary wall 4 so that the wafer 6 remains only supported by the protrusions 2.

In the illustrated embodiment, the article support is substantially circular and is used for supporting a wafer to be illuminated by the projection beam. However, aspects of the invention may be applied to any other article, in particular, to an article in the form of a reticle. Furthermore, the article supports disclosed are electrostatically clamped. However, other types of clamping may be used, such as physical clamping, use of intermolecular binding forces or just gravity force alone.

While specific embodiments of the invention have been described above, it will be appreciated that aspects of the invention may be practiced otherwise than as described. The description is not intended to limit the aspects of the invention.

What is claimed is:

1. A lithographic apparatus comprising:
   an illumination system for conditioning a beam of radiation;

an article support for supporting a substantially flat article to be placed in a beam path of said beam of radiation, said article support comprising a plurality of supporting protrusions, said plurality of supporting protrusions defining a support zone for providing a substantially flat plane of support;

a backfill gas feed arranged in said support zone for providing a backfill gas that flows to a backside of said article when supported by said article support, said backfill gas feed providing an improved thermal conduction between said article and said article support, said support zone being surrounded by a boundary zone having a reduced height relative to said plane of support so that said backfill gas flow is permitted to exit said support zone;

a tunable clamp for clamping said article to said article support; and a flow measuring system that measures the outflow of said backfill gas, the tunable clamp being operatively coupled to said flow measuring system to tune said clamping based on the measured outflow.

2. A lithographic apparatus according to claim 1, wherein said boundary zone comprises a boundary wall defining a boundary wall height that lies below said plane of support.

3. A lithographic apparatus according to claim 2, wherein said boundary wall defines a gap of greater than about 50 nm.

4. A lithographic apparatus according to claim 3, wherein said gap is greater than about 100 nm.

5. A lithographic apparatus according to claim 1, wherein said boundary zone does not comprise a boundary wall.

6. A lithographic apparatus according to claim 1, further comprising a vacuum pump system for providing a vacuum pressure for operating said lithographic apparatus in vacuum pressure conditions, said vacuum pump system operating to eliminate backfill gas flowing from the backside of said article.

7. A lithographic apparatus according to claim 6, wherein said vacuum pump system comprises a suction zone enclosing said support zone.

8. A lithographic apparatus according to claim 1, wherein said tunable clamp is an electrostatic clamp.

9. A lithographic apparatus according to claim 1, wherein said article support is a support for supporting a patterning device, the patterning device serving to impart the projection beam with a pattern in its cross-section.

10. A lithographic apparatus according to claim 1, wherein said article support is a substrate table for holding a substrate to be patterned by a patterned beam onto a target portion of the substrate.

11. An article support for supporting a substantially flat article to be placed in a beam path of a beam of radiation conditioned by an illumination system in a lithographic apparatus, said article support comprising:

a plurality of supporting protrusions defining a support zone for providing a substantially flat plane of support;

a backfill gas feed arranged in said support zone for providing a backfill gas flow to a backside of said article when supported by said article support, said backfill gas feed providing an improved thermal conduction between said article and said article support, said support zone being surrounded by a boundary zone having a reduced height relative to said plane of support so that said backfill gas flow is permitted to exit said support zone;

a tunable clamp for clamping said article to said article support; and a flow measuring system that measures the outflow of said backfill gas, the tunable clamp being operatively coupled to said flow measuring system to tune said clamping based on the measured outflow.

12. A method for clamping an article to an article support in a lithographic apparatus, comprising:

supporting said article on said article support, said article support comprising a plurality of supporting protrusions that define a support zone for providing a substantially flat plane of support, said support zone being surrounded by a boundary zone having a reduced height relative to said plane of support;

flowing a backfill gas to a backside of said article;

measuring said backfill gas flow; and clamping said article to said article support with a force based on said measuring said backfill gas flow so that said backfill gas is permitted to exit said support zone.

13. A method according to claim 12, wherein said clamping is tuned so that said backfill gas is permitted to exit said boundary zone.

14. A method according to claim 12, wherein said clamping is tuned so that said backfill gas flow reaches a predetermined non-zero flow rate.

* * * * *